United States Patent [19]
Erickson

[11] Patent Number: 5,790,945
[45] Date of Patent: Aug. 4, 1998

[54] RESONATOR FOR COUPLING INTERMEDIATE FREQUENCY SIGNALS FROM A RADIO FREQUENCY MIXER

[75] Inventor: Bruce A. Erickson, Santa Rosa, Calif.

[73] Assignee: Hewlett-Packard Company, Palo Alto, Calif.

[21] Appl. No.: 781,563

[22] Filed: Jan. 9, 1997

[51] Int. Cl.$^6$ .................................................. H04B 1/26
[52] U.S. Cl. ........................... 455/325; 455/327; 455/319; 455/330
[58] Field of Search ........................ 455/313, 317, 455/318, 319, 325, 327, 330, 323, 257, 113, 355, 383

[56] References Cited

U.S. PATENT DOCUMENTS

| | | | |
|---|---|---|---|
| 4,541,124 | 9/1985 | Lacour et al. | 455/327 |
| 5,157,786 | 10/1992 | Muterspaugh | 455/330 |
| 5,179,732 | 1/1993 | Omoto | 455/330 |
| 5,553,319 | 9/1996 | Tanbakuchi | 455/319 |

FOREIGN PATENT DOCUMENTS 0107617  7/1982  Japan .................................. 455/325

OTHER PUBLICATIONS

Eisenberg et al., Double–Double Balanced MMIC Mixer, Litton Solid State Division, California, Fall 1991.

Primary Examiner—Edward F. Urban
Assistant Examiner—Edan Orgad
Attorney, Agent, or Firm—John L. Imperato

[57] ABSTRACT

A dumbbell shaped resonator efficiently couples IF signals from short transmission lines to an output transmission line at a radio frequency (RF) mixer's IF output port. The RF mixer uses short transmission lines and terminating resistors to match impedances within the mixer and to minimize the mixer's distortion. The RF mixer, including the dumbbell resonator, is constructed on a printed circuit board and has a low manufacturing cost. Alternatively, the output transmission line is center-tapped to provide a pair of IF signals having opposite phases.

19 Claims, 3 Drawing Sheets

RESONATOR FOR COUPLING INTERMEDIATE FREQUENCY SIGNALS FROM A RADIO FREQUENCY MIXER

FIELD OF THE INVENTION

The present invention relates to radio frequency mixers, and more particularly, to a radio frequency mixer having a resonator for coupling signals to the mixer's intermediate frequency port.

BACKGROUND OF THE INVENTION

Radio frequency (RF) mixers are used to convert applied RF signals to intermediate frequency (IF) signals at the input section of an RF spectrum analyzer. Low mixer distortion and high isolation between local oscillator (LO) signals applied to the mixer and the IF signals produced by the mixer enable an RF spectrum analyzer to accurately represent the spectral content of applied RF signals. RF mixers such as those used in the Hewlett-Packard Company's model HP8566 spectrum analyzer incorporate a half-wavelength balun structure to couple LO signals to the mixer and provide isolation between the LO and IF signals. However, the wavelength dependence and the physical size of the balun limits the low frequency performance of this type of mixer. Other types of RF mixers used in RF spectrum analyzers use four mixing diodes to achieve low distortion, but the grounding schemes for the diodes rely on elaborate mechanical assemblies which make this type of mixer difficult to manufacture.

SUMMARY OF THE INVENTION

According to a preferred embodiment of the present invention, an RF mixer uses short transmission line segments and terminating resistors to match impedances within the mixer and minimize the mixer's distortion. A dumbbell shaped resonator efficiently couples IF signals from the short transmission line segments to an output transmission line at the mixer's IF output port. The RF mixer, including the dumbbell resonator, is constructed on a printed circuit board and has a low manufacturing cost. According to an alternate preferred embodiment of the present invention, a pair of output transmission lines provides a pair of IF signals having opposite phases.

DETAILED DESCRIPTION OF THE PREFERRED EMBODIMENT

Figure 1:
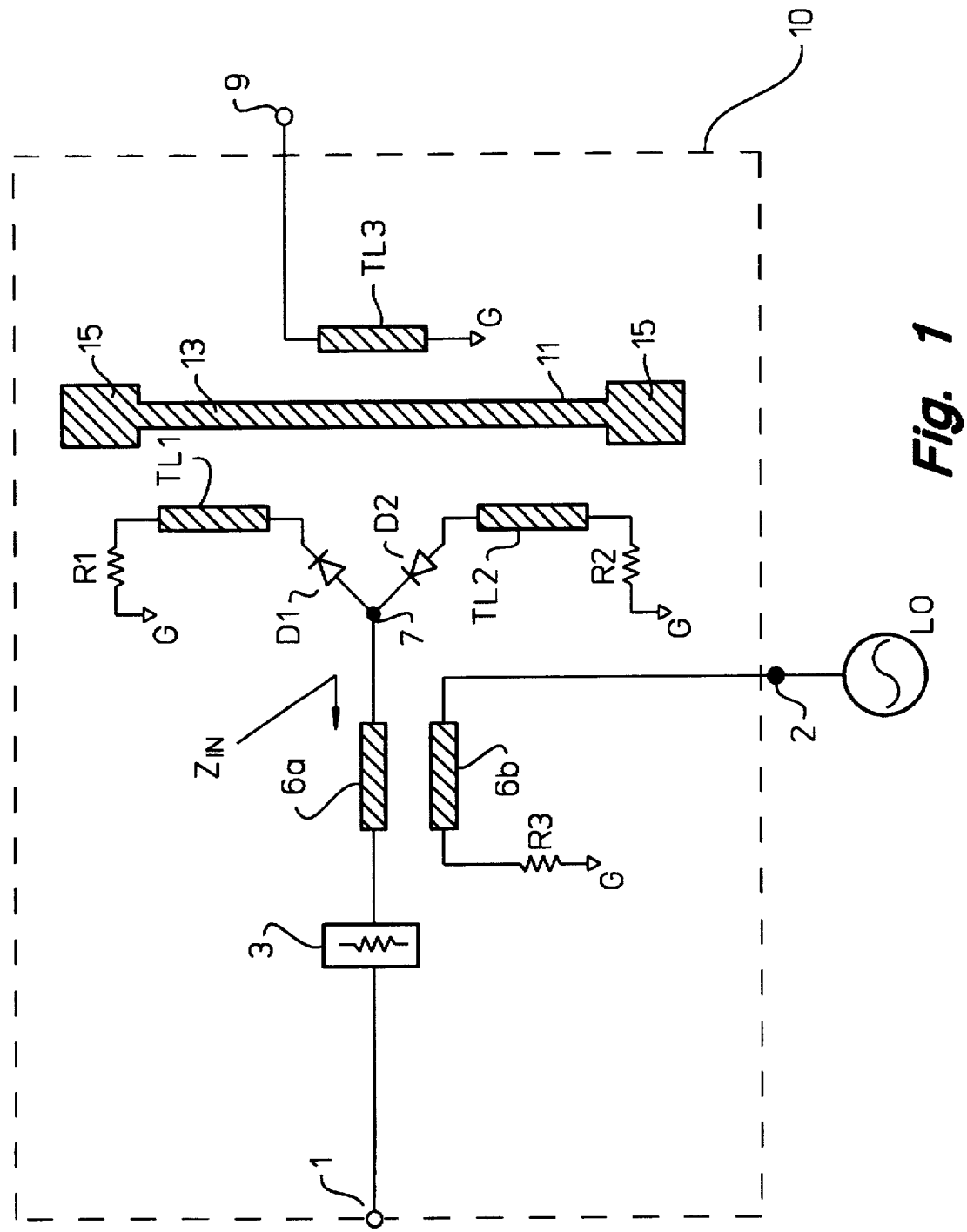
FIG. 1 shows an RF mixer, including a resonator, constructed according to a preferred embodiment of the present invention.

FIG. 1 shows an RF mixer 10 constructed according to a preferred embodiment of the present invention. RF signals are applied to the RF mixer 10 at the RF input 1. In this example, the RF signals applied to the RF input 1 range in frequency from DC to 1.5 GHz. An LO signal is applied by a local oscillator (LO) to a LO port 2 of the RF mixer 10. The LO signal is adjusted in frequency over a frequency range from 2.4 GHz to 3.9 GHz, so that the frequency difference between the LO signal and the RF signal is 2.4 GHz. The frequency difference signal, or intermediate frequency (IF) signal, produced by the RF mixer 10 from the RF and LO signals has a frequency of 2.4 GHz and is supplied by the RF mixer 10 at an IF port 9. Alternatively, another mixing product produced by the RF mixer 10, such as a frequency sum signal of the LO signal and RF signal provides the IF signal at the IF port 9.

The RF signal and LO signal couple through coupled transmission line sections 6a and 6b so that the RF signal and LO signal are superimposed and are both present at the junction node 7 positioned between mixer diodes D1 and D2. The impedance $Z_{IN}$ looking back from junction node 7 toward the RF input 1 is matched to the system's 50 ohm characteristic impedance over a broad frequency range encompassing the LO signal frequency range of 2.4–3.9 GHz and the frequency range of the LO signal's harmonics generated by mixing diodes D1 and D2. The impedance $Z_{IN}$ may be matched using an attenuator 3 or other known impedance matching structure. As a result of the matched impedance $Z_{IN}$, reflections of the LO signal and its harmonics between the RF input 1 and the junction node 7 are minimized.

Typically, the power of the LO signal is sufficient to form current conduction waveforms in each diode D1 and D2 that approximate a square wave. The square wave rapidly traverses between an "off" or non-conducting state and an "on" or conducting state of each of the diodes D1 and D2, significantly reducing distortion caused by nonlinear impedance variations of diodes D1 and D2 when the diodes operate at low current levels. The LO signal drives diode D1 to the conducting (low resistance) state, while diode D2 is in the non-conducting (high resistance) state and alternately drives diode D2 to the conducting state while diode D1 is in the non-conducting state. The matched impedance $Z_{IN}$ prevents harmonics of the LO signals present in the square wave from reflecting from the impedance $Z_{IN}$ and combining with the applied LO signals at various amplitudes and phases to distort the current conduction waveform of diodes D1 and D2. Thus, the matched impedance $Z_{IN}$ reduces distortion in the RF mixer 10.

The transmission line 6a connects to two signal branches of the RF mixer 10 at the junction node 7. In the first branch, diode D1 connects between the junction node 7 and a transmission line TL1. Transmission line TL1 connects in series between diode D1 and terminating resistor R1. R1 also connects to ground G. A second branch, similar to the first branch includes diode D2, transmission line TL2 and terminating resistor R2, and connects to junction node 7 in parallel with the first branch. Diodes D1 and D2 have matched resistances in the conducting state and other matched performance parameters that balance signals in each of the two signal branches of the RF mixer 10.

Diodes D1 and D2 connect to junction node 7 in opposite polarity and alternately conduct, depending on the polarity of the waveform of the LO signal present at the junction node 7. When either diode is in the conducting state, the impedance at junction node 7 is nominally 40 ohms, equal to the sum of one terminating resistor R1 or R2, depending on whether diode D1 or D2 is conducting, and the diode resistance in the conducting state, which in this case is approximately 20 ohms. In this example, the transmission lines TL1 and TL2 are each 1/20th of a wavelength long at the IF frequency (2.4 GHz) and each have a characteristic impedance of 20 ohms. Even harmonics generated by the alternate conduction of diodes D1 and D2 circulate in transmission lines TL1 and TL2 and are terminated in resistors R1 and R2. Conversion efficiency, which is the ratio of the IF signal power at the IF port 9 to the RF power applied to the RF port 1, generally decreases as the values of R1 and R2 increase while distortion performance generally improves as R1 and R2 increase. A value of 20 ohms for resistors R1 and R2 provides the desired trade-off between distortion performance and conversion efficiency for the RF mixer 10 in RF spectrum analyzer applications. Conversion efficiency may be improved at the expense of distortion performance, by decreasing the value of resistors R1 and R2 or by replacing resistors R1 and R2 with short circuit connections to ground G. The length and characteristic impedance of transmission lines TL1 and TL2 may also be adjusted.

Figure 2B:
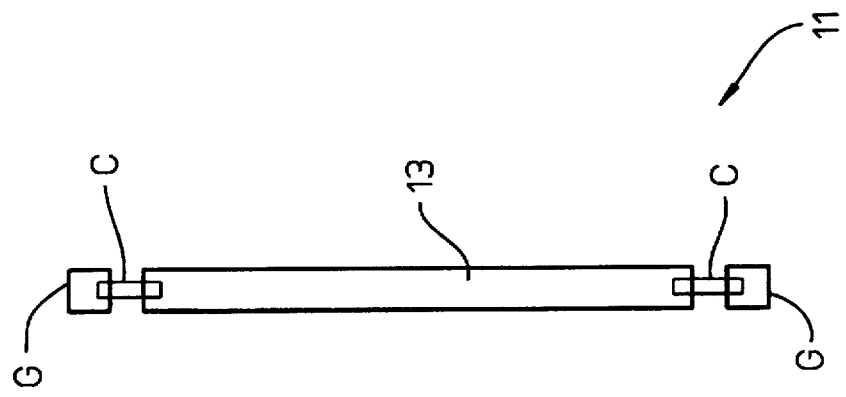
FIGS. 2A and 2B show alternate constructions of the resonator included in FIG. 1.
Figure 2A:
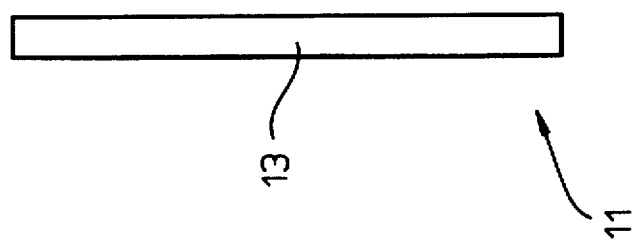

A dumbbell resonator 11 couples the signals at the fixed IF frequency (2.4 GHz in this example) from the short transmission line segments TL1 and TL2 to the output transmission line TL3. The output transmission line TL3 provides the IF signal at the RF mixer 10's IF port 9. In the absence of the dumbbell resonator 11, the physically short transmission lines TL1 and TL2 provide insufficient coupling to the output transmission line TL3 at the IF port 9. In this example, the dumbbell resonator 11 and the output transmission line TL3 are printed on an internal layer of a four-layer printed circuit (PC) board. The transmission lines TL1 and TL2 are printed on a top external layer of the PC board, and a ground plane is formed on the bottom external layer of the PC board. The dumbbell resonator 11 has a high impedance line 13 that is centered about the junction node 7 and transmission lines TL1 and TL2. At each end of the high impedance line 13 is a low impedance transmission line 15. The resulting dumbbell resonator 11 provides efficient coupling of IF signals to the output transmission line TL3 while reducing coupling of signals beyond the frequency range of the IF signal and suppressing the coupling of unwanted mixing products and LO signal harmonics outside of the IF signal's frequency range. The length of the dumbbell resonator 11 may be empirically determined to selectively couple signals at the IF frequency to the IF port 9. Depending on the desired coupling characteristics, the low impedance transmission lines 15 may be omitted, forming the dumbbell resonator 11 simply from the high impedance transmission line 13 as shown in FIG. 2A. Alternatively, shunt capacitors C shown in FIG. 2B are connected between each end of the dumbbell resonator 11 and the ground G to change the physical size and frequency selectivity of the dumbbell resonator 11.

The transmission lines TL1 and TL2 are each parallel to a portion of the high impedance line 13 of the dumbbell resonator 11. The output transmission line TL3 is also parallel to the high impedance line 13 and provides an IF signal at the IF port 9 of the RF mixer 10. The transmission lines TL1 and TL2 and the output transmission line TL3 in this example are formed by printing a conductor over a planar ground G.

Figure 3:
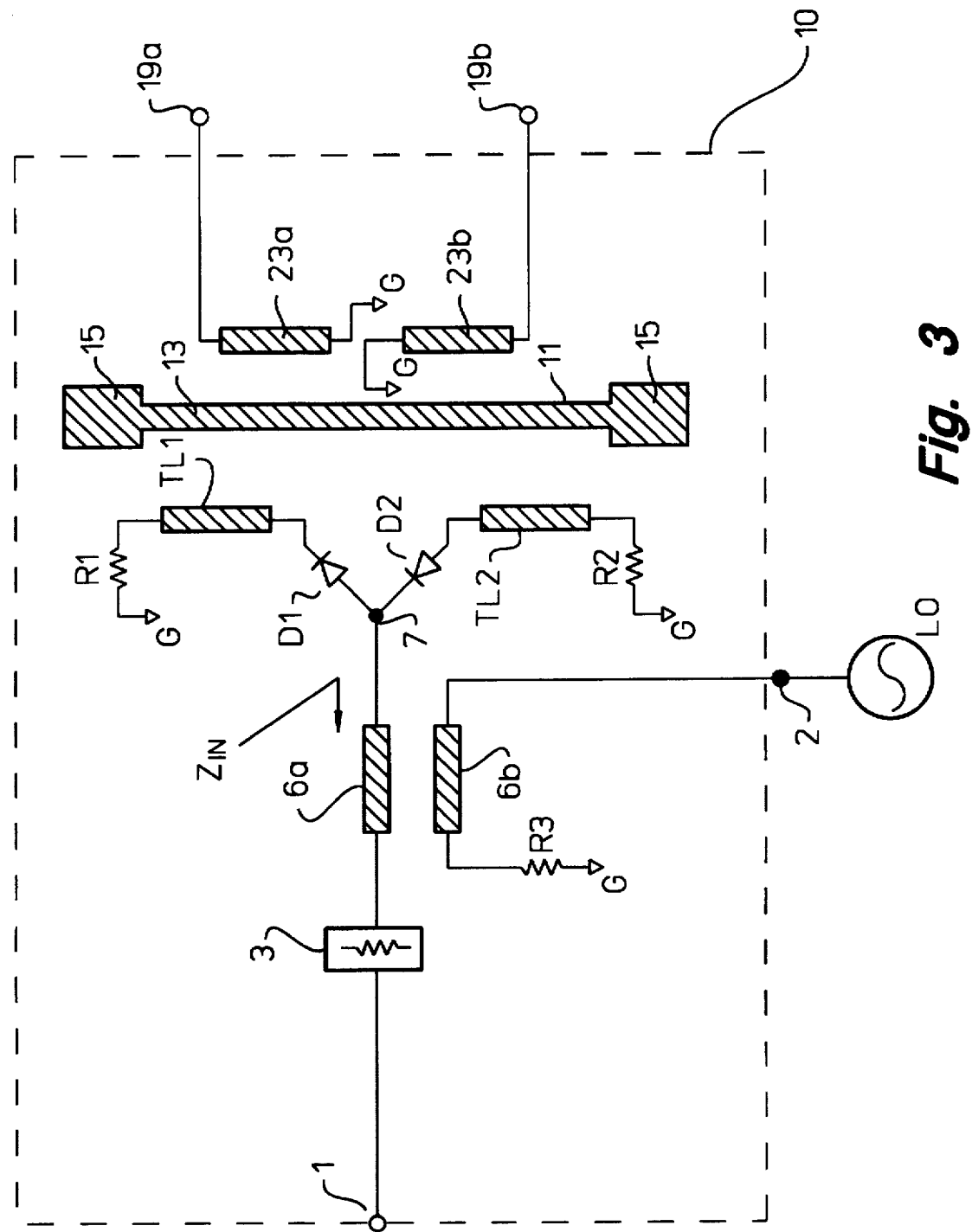
FIG. 3 shows an RF mixer having a pair of output transmission lines constructed according to an alternate preferred embodiment of the present invention.

According to an alternate preferred embodiment of the present invention as shown in FIG. 3, a pair of output transmission lines 23a, 23b connect to ground. Adjacent or opposite ends of each transmission line 23a, 23b provide a pair of IF signals at IF ports 19a and 19b, that have equal amplitudes and opposite phases. Adjacent ends of output transmission lines 23a, 23b are shown connected to ground G. These two IF signals provide an "in phase" and "out-of-phase" signal that may be used to drive other circuitry within an RF spectrum analyzer or other system.

What is claimed is:

1. A radio frequency mixer, comprising:

a first port receiving a radio frequency signal;

a second port receiving a local oscillator signal;

a signal coupler coupled to the first and second ports, superimposing the radio frequency signal and the local oscillator signal;

a node coupled to the signal coupler, receiving the superimposed radio frequency signal and local oscillator signal;

a pair of diodes generating a mixing product of the radio frequency signal and the local oscillator signal, each diode having a low resistance value when in the conducting state and each having a high resistance value when in the non-conducting state, each diode having a first terminal and a second terminal, the first terminal of the first diode of the pair coupled to the node and the second terminal of the second diode of the pair coupled to the node;

a first transmission line having a first end and a second end, the first end of the first transmission line coupled to the second terminal of the first diode;

a first resistor coupled between the second end of the first transmission line and a ground;

a second transmission line having a first end and a second end, the first end of the second transmission line coupled to the first terminal of the second diode;

a second resistor coupled between the second end of the second transmission line and the ground;

a resonator coupled to the first and the second transmission lines, the resonator having a central transmission line section and a pair of end transmission line sections, each end transmission line section continuous with the central transmission line section and at an opposite end of the central transmission line section;

an output transmission line coupled to the resonator, the output transmission line having a first end and a second end the first end connected to the ground; and a third port connected to the second end of the output transmission line, providing an output signal having a frequency equal to the frequency of the mixing product.

2. The radio frequency mixer of claim 1 wherein each end transmission line section has a characteristic impedance lower than the characteristic impedance of the central transmission line section.

3. The radio frequency mixer of claim 1 further comprising a pair of capacitors, each capacitor of the pair coupled between one of the end transmission line sections and the ground.

4. The radio frequency mixer of claim 1 wherein the characteristic impedance of the first transmission line and the characteristic impedance of the second transmission line are equal.

5. The radio frequency mixer of claim 1 wherein the first transmission line and the second transmission line have equal lengths.

6. The radio frequency mixer of claim 1 wherein the first and second transmission lines are parallel to the central transmission line section of the resonator and the output transmission line.

7. The radio frequency mixer of claim 6 wherein the first transmission line, the second transmission line, the resonator and the output transmission line are printed on a printed circuit board.

8. A radio frequency mixer, comprising:

a first port receiving a radio frequency signal;

a second port receiving a local oscillator signal;

a signal coupler coupled to the first and second ports, superimposing the radio frequency signal and the local oscillator signal;

a node coupled to the signal coupler, receiving the superimposed radio frequency signal and local oscillator signal;

a pair of diodes generating a mixing product of the radio frequency signal and the local oscillator signal, each diode having a low resistance value when in the conducting state and each having a high resistance value when in the non-conducting state, each diode having a first terminal and a second terminal, the first terminal of the first diode of the pair coupled to the node and the second terminal of the second diode of the pair coupled to the node;

a first transmission line having a first end and a second end, the first end of the first transmission line coupled to the second terminal of the first diode, the second end of the first transmission line connected to a ground;

a second transmission line having a first end and a second end, the first end of the second transmission line coupled to the first terminal of the second diode, the second end of the second transmission line connected to the ground;

a resonator coupled to the first and the second transmission lines, the resonator having a central transmission line section and a pair of end transmission line sections, each end transmission line section continuous with the central transmission line section and at an opposite end of the central transmission line section;

an output transmission line coupled to the resonator, the output transmission line having a first end and a second end the first end connected to the ground; and a third port connected to the second end of the output transmission line, providing an output signal having a frequency equal to the frequency of the mixing product.

9. The radio frequency mixer of claim 8 wherein each end transmission line section has a characteristic impedance lower than the characteristic impedance of the central transmission line section.

10. The radio frequency mixer of claim 8 further comprising a pair of capacitors, each capacitor of the pair coupled between one of the end transmission line sections and the ground.

11. The radio frequency mixer of claim 8 wherein the characteristic impedance of the first transmission line and the characteristic impedance of the second transmission line are equal.

12. The radio frequency mixer of claim 8 wherein the first transmission line and the second transmission line have equal lengths.

13. The radio frequency mixer of claim 8 wherein the first and second transmission lines are parallel to the central transmission line section of the resonator and the output transmission line.

14. A radio frequency mixer, comprising:

a first port receiving a radio frequency signal;

a second port receiving a local oscillator signal;

a signal coupler coupled to the first and second ports, superimposing the radio frequency signal and the local oscillator signal;

a node coupled to the signal coupler, receiving the superimposed radio frequency signal and local oscillator signal;

a pair of diodes generating a mixing product of the radio frequency signal and the local oscillator signal, each diode having a low resistance value when in the conducting state and each having a high resistance value when in the non-conducting state, each diode having a first terminal and a second terminal, the first terminal of the first diode of the pair coupled to the node and the second terminal of the second diode of the pair coupled to the node;

a first transmission line having a first end and a second end, the first end of the first transmission line coupled to the second terminal of the first diode;

a first resistor coupled between the second end of the first transmission line and a ground;

a second transmission line having a first end and a second end, the first end of the second transmission line coupled to the first terminal of the second diode;

a second resistor coupled between the second end of the second transmission line and the ground;

a resonator coupled to the first and the second transmission lines, the resonator having a central transmission line section and a pair of end transmission line sections, each end transmission line section continuous with the central transmission line section and at an opposite end of the central transmission line section;

a pair of output transmission lines coupled to the resonator, each output transmission line having a first end and a second end the first end of each output transmission line connected to the ground;

a first output port connected to the second end of the first output transmission line of the pair, providing a first output signal having a frequency equal to the frequency of the mixing product; and a second output port connected to the second end of the second output transmission line of the pair, providing a second output signal having a frequency and amplitude equal to those of the first output signal and having a phase opposite that of the first output signal.

15. The radio frequency mixer of claim 14 wherein each end transmission line section has a characteristic impedance lower than the characteristic impedance of the central transmission line section.

16. The radio frequency mixer of claim 14 further comprising a pair of capacitors, each capacitor of the pair coupled between one of the end transmission line sections and the ground.

17. The radio frequency mixer of claim 14 wherein the characteristic impedance of the first transmission line and the characteristic impedance of the second transmission line are equal.

18. The radio frequency mixer of claim 14 wherein the first transmission line and the second transmission line have equal lengths.

19. The radio frequency mixer of claim 14 wherein the first and second transmission lines are parallel to the central transmission line section of the resonator and the output transmission line.

* * * * *